United States Patent
Kammerer et al.

(10) Patent No.: US 8,648,619 B2
(45) Date of Patent: Feb. 11, 2014

(54) TERMINATION FOR COMPLEMENTARY SIGNALS

(75) Inventors: William Kammerer, Los Altos, CA (US); Kalyan Kavalipurapu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/302,909

(22) Filed: Nov. 22, 2011

(65) Prior Publication Data

US 2013/0127492 A1    May 23, 2013

(51) Int. Cl.
    *H03K 19/003* (2006.01)
(52) U.S. Cl.
    USPC ............... 326/30; 326/21; 326/32; 327/108
(58) Field of Classification Search
    USPC ............... 326/21, 30, 32, 86; 327/107–112
    See application file for complete search history.

(56) References Cited

U.S. PATENT DOCUMENTS

| 6,448,815 | B1 * | 9/2002 | Talbot et al. ............... 326/86 |
| 6,670,830 | B2 * | 12/2003 | Usami et al. ............... 326/86 |
| 6,836,144 | B1 | 12/2004 | Bui et al. |
| 7,023,255 | B1 * | 4/2006 | Mercer .................. 327/199 |
| 7,459,929 | B2 | 12/2008 | Chung |
| 7,728,630 | B1 | 6/2010 | Ren et al. |
| 7,915,914 | B1 | 3/2011 | Ker et al. |
| 2009/0243571 | A1 * | 10/2009 | Cook et al. ............... 323/280 |
| 2010/0201397 | A1 | 8/2010 | Gillingham |
| 2011/0109344 | A1 | 5/2011 | Choi et al. |

* cited by examiner

*Primary Examiner* — Vibol Tan
(74) *Attorney, Agent, or Firm* — Schwegman, Lundberg & Woessner, P.A.

(57) ABSTRACT

Apparatuses including termination for complementary signals are described, along with methods for terminating complementary signals. One such apparatus includes a termination transistor including a first node configured to receive a first complementary signal and a second node configured to receive a second complementary signal. A regulation circuit can generate a regulated voltage to render the termination transistor conductive with a substantially constant resistance. In one such method, a first complementary signal is received at a drain of a termination transistor and a second complementary signal is received at a source of the termination transistor. Energy of the complimentary signals can be absorbed when the termination transistor is rendered conductive. Additional embodiments are also described.

16 Claims, 7 Drawing Sheets

TERMINATION FOR COMPLEMENTARY SIGNALS

BACKGROUND

Non-volatile semiconductor memories (NVSMs) are widely used in many electronic devices such as personal digital assistants (PDAs), laptop computers, mobile phones and digital cameras. A NVSM can receive data from a bus with a termination.

BRIEF DESCRIPTION OF THE DRAWINGS

Some embodiments are illustrated by way of example and not limitation in the figures of the accompanying drawings in which.

DETAILED DESCRIPTION

In this description, a transistor is described as being activated or switched on when it is rendered conductive by a control gate voltage that is greater than its source voltage by at least its threshold voltage. The transistor is described as being in an inactive state or switched off when the control gate voltage is not greater than its source voltage by at least the threshold voltage and the transistor is rendered non-conductive.

Terminations are employed to substantially reduce signal reflection on a transmission line. Signal reflection can take place on a line if an impedance of a receiver or a driver is different from a characteristic impedance of the line. The discontinuity in the impedance causes the reflection. A signal can reflect back and forth along the line and the reflections may need to dissipate before the signal is accepted as valid. Signal reflection can be reduced by damping and/or dissipating the reflections with a termination. A termination is a dissipating and/or damping load, typically a resistive device that has an impedance that is substantially similar to the characteristic impedance of the line. A termination can be placed in a driver or a receiver or in both a driver and a receiver connected to the line.

Termination of two lines receiving complementary signals can be accomplished with a pair of resistances coupled (e.g., electrically connected, whether directly or indirectly) to each line. The pair of resistances is coupled in series between a supply voltage and a reference voltage (e.g., ground), and the line is coupled to a location between the pair of resistances. The resistances dissipate power by drawing a substantial amount of DC current from the voltage supply that supplies the supply voltage. The resistances can also add a significant amount of loading capacitance to a circuit. The inventors have discovered that the challenges noted above, as well as others, can be addressed by a termination transistor including a first node coupled to receive a first complementary signal and a second node coupled to receive a second complementary signal. A "node" can include, for example, a contact, electrical junction, electrode, interconnect, line, pad, pin, region, terminal, or combinations or any or all of the above).

Figure 1:
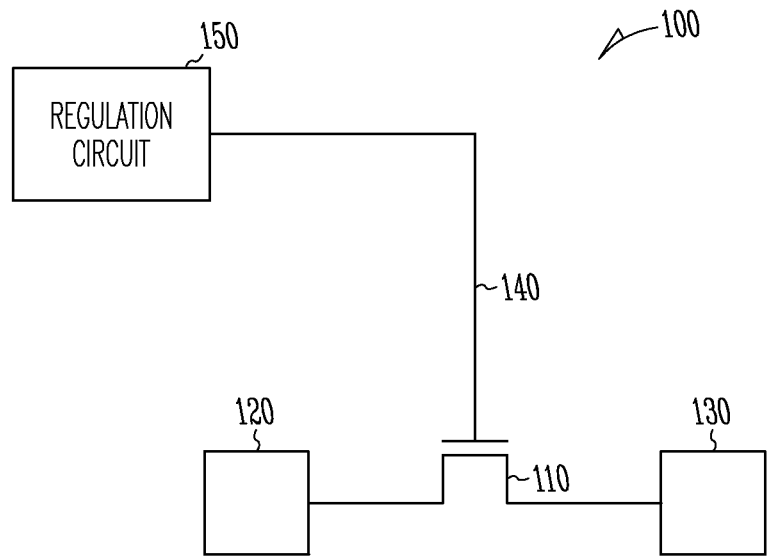
FIG. 1 is an electrical schematic diagram of an apparatus in the form of a termination according to various embodiments of the invention.

FIG. 1 is an electrical schematic diagram of an apparatus in the form of a termination 100 according to various embodiments of the invention. A termination transistor 110 has a drain coupled to a drain node 120 to receive a first complementary signal, and a source coupled to a source node 130 to receive a second complementary signal. The first and second complementary signals are substantially complementary to each other, and may or may not be perfectly complementary to each other. The termination transistor 110 is an n-channel transistor according to various embodiments of the invention.

A gate 140 of the termination transistor 110 is coupled to a regulation circuit 150 that can generate a regulated voltage on the gate 140. The regulated voltage can render the termination transistor 110 conductive while the termination 100 is to receive the first and second complementary signals on the nodes 120 and 130, respectively. The termination transistor 110 behaves as two virtual resistors in series that cross-terminate each other to provide a virtual ground in a channel of the termination transistor 110. The termination transistor 110 can absorb energy of the first and second complementary signals while the channel remains at the virtual ground because the transitional energies of the complementary signals are substantially equal and opposite. The transitional energy of one of the complementary signals is substantially canceled by the transitional energy of the other complementary signal in the channel of the termination transistor 110.

The regulated voltage can maintain a conductive state of the termination transistor 110 through changes in process, temperature and supply voltage.

Figure 2:
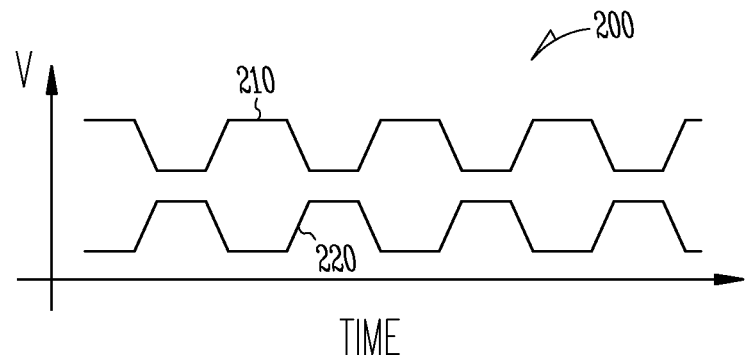
FIG. 2 is a timing chart of complementary signals according to various embodiments of the invention.

FIG. 2 is a timing chart 200 of complementary signals according to various embodiments of the invention. A first signal 210 and a second signal 220 are complementary digital signals that transition between a low voltage and a high voltage. The first signal 210 is high when the second signal 220 is low, and the first signal 210 is low when the second signal 220 is high. The first signal 210 and the second signal 220 can be complementary clock signals according to various embodiments of the invention. The first signal 210 and the second signal 220 can be the first and second complementary signals received by the drain node 120 and the source node 130 in the termination 100 shown in FIG. 1. The first signal 210 and the second signal 220 are perfectly complementary if complementary edges and transitions of the first signal 210 and the second signal 220 occur at exactly the same time. The first signal 210 and the second signal 220 are not perfectly complementary if the complementary edges and transitions of the first signal 210 and the second signal 220 do not occur at exactly the same time.

Figure 3:
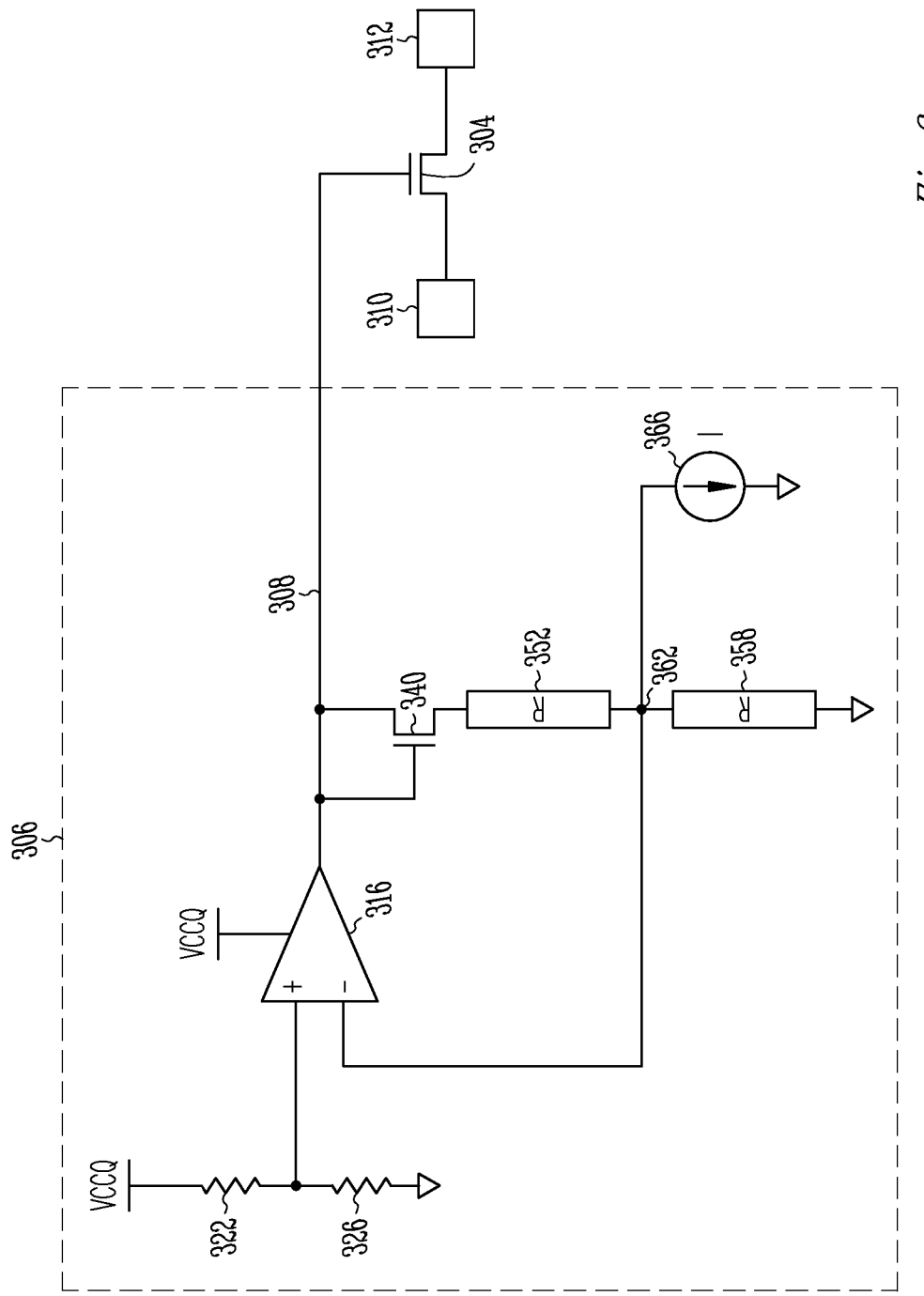
FIG. 3 is an electrical schematic diagram of an apparatus in the form of a termination and a regulation circuit according to various embodiments of the invention.

FIG. 3 is an electrical schematic diagram of an apparatus in the form of a termination and a regulation circuit according to various embodiments of the invention. The termination includes an n-channel termination transistor 304 and a regulation circuit 306. The regulation circuit 306 comprises a voltage follower circuit and can generate a regulated voltage on a line 308 coupled to a gate of the termination transistor 304. The regulated voltage can maintain a conductive state of the termination transistor 304 such that its resistance does not change substantially through changes in process, temperature and an input and output (I/O) supply voltage (e.g., VCCQ).

The termination transistor 304 has a drain coupled to a drain node 310 to receive a first complementary signal, and a source coupled to a source node 312 to receive a second complementary signal. The first and second complementary signals are substantially complementary to each other, and may or may not be perfectly complementary to each other. The first and second complementary signals can be the first signal 210 and the second signal 220 shown in FIG. 2.

A high gain operational amplifier 316 in the regulation circuit 306 can generate the regulated voltage on the line 308. The operational amplifier 316 is coupled to a supply voltage node to receive an I/O supply voltage, such as VCCQ, and has a non-inverting input coupled to a node of a voltage divider to receive a portion of the supply voltage, K1*VCCQ where "*" represents multiplication. The supply voltage VCCQ is reduced by a voltage divider including two resistances 322 and 326 to generate the portion of the supply voltage K1*VCCQ. A first end of the resistance 322 is coupled to a supply voltage (VCCQ) node. A second end of the resistance 322 is coupled to the non-inverting input of the operational amplifier 316 and a first end of the resistance 326. A second end of the resistance 326 is coupled to a reference (e.g., ground) voltage node. The resistance 322 is approximately three times the resistance 326 such that K1 is approximately 0.25 according to various embodiments of the invention.

The regulated voltage on the line 308 is coupled to a drain and a gate of a diode-connected matched transistor 340. The matched transistor 340 is an n-channel transistor that is matched to the termination transistor 304. The termination transistor 304 and the matched transistor 340 are "matched" in that they are, for example, transistors of the same type, have substantially the same dimensions and are fabricated at substantially the same time in substantially the same way. Matched transistors are physically close in a semiconductor and have sources and drains oriented in the same direction. A source of the matched transistor 340 is coupled to a first end of a resistance 352. A second end of the resistance 352 is coupled to a first end of a resistance 358. A second end of the resistance 358 is coupled to a reference (e.g., ground) voltage node. An inverting input of the operational amplifier 316 is coupled to receive a feedback signal from a node 362 between a current source 366, the second end of the resistance 352 and the first end of the resistance 358. The resistances 352 and 358 have approximately the same resistance R.

The operational amplifier 316 can generate the regulated voltage on the line 308 to bring the non-inverting input and the inverting input to substantially the same potential (current flows from the line 308 through the matched transistor 340 and the resistances 352 and 358 to the reference (e.g., ground) voltage node). The feedback signal on the inverting input of the operational amplifier 316 is approximately equal to the regulated voltage on the line 308 less a threshold voltage of the matched transistor 340 and the voltage drop across the resistance 352. The regulated voltage on the line 308 is modified by current drawn by the current source 366 that changes with a temperature of the regulation circuit 306 as is described below. The current source 366 has a resistance that is larger (approximately fifteen times larger) than the resistance 358 such that it draws less current than the resistance 358 without substantially affecting a ratio of the resistance 352 to the resistance 358.

The regulated voltage on the line 308 is adjusted (e.g., modulated) for changes in the supply voltage (e.g., VCCQ), temperature of the regulation circuit 306, and process associated with the fabrication of the termination transistor 304 and the matched transistor 340. The regulation circuit 306 can adjust the regulated voltage in response to changes in the supply voltage through the portion of the supply voltage K1*VCCQ coupled to the non-inverting input of the operational amplifier 316. A rise in the supply voltage results in a rise in the regulated voltage, and a fall in the supply voltage results in a fall in the regulated voltage.

The regulation circuit 306 can adjust the regulated voltage on the line 308 in response to changes in the process associated with the fabrication of the termination transistor 304. For example, a change in the process that results in the termination transistor 304 having a relatively higher threshold voltage $V_T$ results in the regulation circuit 306 being configured to generate relatively higher regulated voltage as the change in process would also result in the matched transistor 340 having a relatively higher threshold voltage. Similarly, a change in the process that results in the termination transistor 304 having a relatively lower threshold voltage $V_T$ results in the regulation circuit 306 being configured to generate a relatively lower regulated voltage due to the change in process also resulting in the matched transistor 340 having a relatively lower threshold voltage.

The regulation circuit 306 adjusts the regulated voltage on the line 308 in response to changes in temperature with the current source 366 that draws a current I from the node 362 between the inverting input of the operational amplifier 316, the second end of the resistance 352, and the first end of the resistance 358. The current I is drawn to the reference (e.g., ground) voltage node. Changes in temperature are addressed because mobilities of the matched transistor 340 and the termination transistor 304 decrease with an increasing temperature and increase with a decreasing temperature. This technique results in a resistance across the termination transistor 304 that remains substantially constant when the termination transistor 304 is switched on.

The current source 366 is temperature dependent such that if the temperature of an integrated circuit including the regulation circuit 306 increases the current I drawn by the current source 366 also increases such that a voltage drop across the resistance 352 increases. The increased voltage drop across the resistance 352 increases the regulated voltage on the line 308. If the temperature of the integrated circuit including the regulation circuit 306 decreases, the current I drawn by the current source 366 also decreases such that a voltage drop across the resistance 352 decreases. The decreased voltage drop across the resistance 352 decreases the regulated voltage on the line 308.

The regulated voltage on the line 308 is approximately equal to $2*K1*VCCQ+V_T+K2*I*R$. K2 is a trim constant between 0.25 and 1.0 that can be changed during testing of a wafer or integrated circuit chip including the regulation circuit 306.

Figure 4:
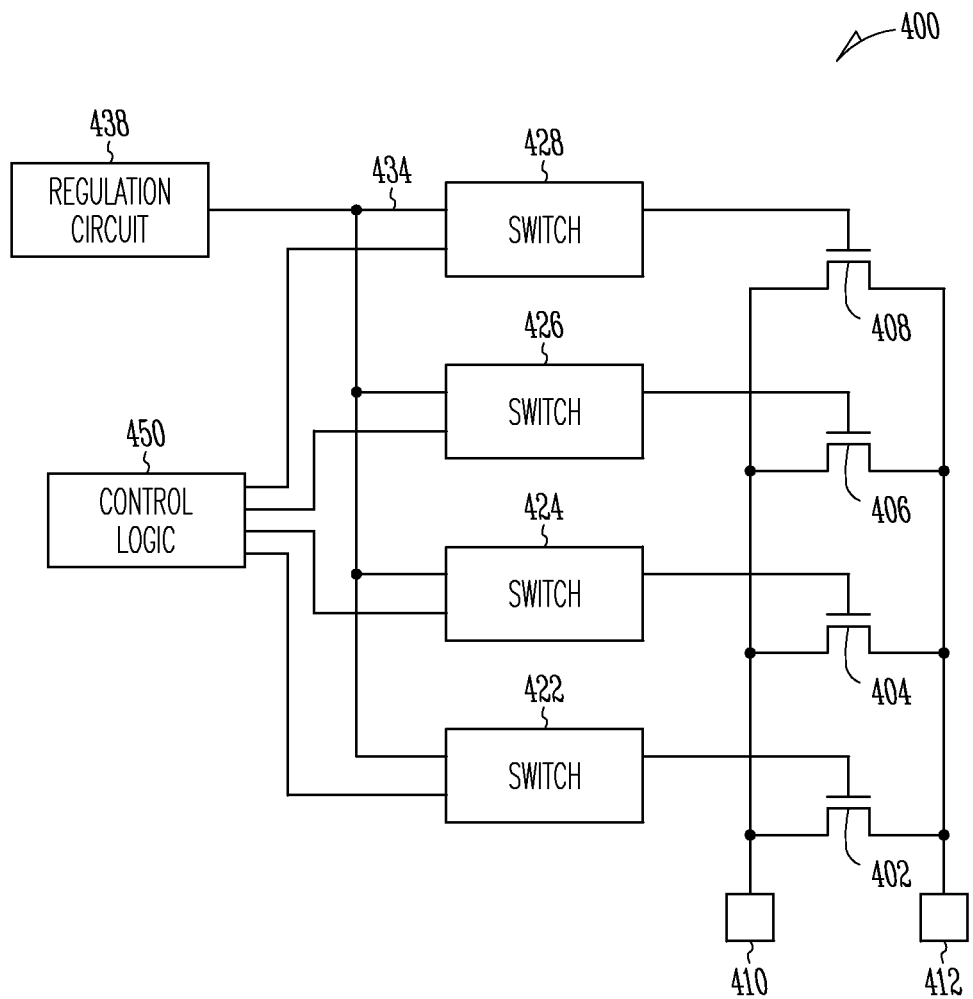
FIG. 4 is an electrical schematic diagram of an apparatus in the form of a termination according to various embodiments of the invention.

FIG. 4 is an electrical schematic diagram of an apparatus in the form of a termination 400 according to various embodiments of the invention. Four termination transistors 402, 404, 406 and 408 are coupled in parallel between a drain node 410 and a source node 412. The termination transistors 402, 404, 406 and 408 each have a drain coupled to the drain node 410 to receive a first complementary signal, and a source coupled to the source node 412 to receive a second complementary signal. The first and second complementary signals are substantially complementary to each other, and may or may not be perfectly complementary to each other. The first and second complementary signals can be the first signal 210 and the second signal 220 shown in FIG. 2 according to various embodiments of the invention. The termination transistors 402, 404, 406 and 408 can be selectively switched on or off to adjust an equivalent resistance between the drain node 410 and the source node 412. The equivalent resistance is the resistance of all of the termination transistors 402, 404, 406 and 408 coupled in parallel between the drain node 410 and the source node 412. The termination transistors 402, 404, 406 and 408 are n-channel field-effect transistors according to various embodiments of the invention.

Gates of the termination transistors 402, 404, 406 and 408 are each coupled to a respective one of four switches 422, 424, 426 and 428 that can couple the gates individually to a line 434 from a regulation circuit 438. The regulation circuit 438 can generate a regulated voltage to render one or more of the termination transistors 402, 404, 406 and 408 conductive while the termination 400 is operating to receive the first and second complementary signals. The regulated voltage can be selectively provided to the gates of the termination transistors 402, 404, 406 and 408 through the respective switches 422, 424, 426 and 428. The regulated voltage can maintain a conductive state of one or more of the termination transistors 402, 404, 406 and 408 through changes in temperature and a supply voltage.

The switches 422, 424, 426 and 428 may be transistors and are each switched on or off by a respective control signal from a control logic circuit 450. The switch 422 can couple the gate of the termination transistor 402 to the regulation circuit 438 or switch the termination transistor 402 off. The switch 424 can couple the gate of the termination transistor 404 to the regulation circuit 438 or switch the termination transistor 404 off. The switch 426 can couple the gate of the termination transistor 406 to the regulation circuit 438 or switch the termination transistor 406 off. Finally, the switch 428 can couple the gate of the termination transistor 408 to the regulation circuit 438 or switch the termination transistor 408 off. The switches 422, 424, 426 and 428 thereby control which of the termination transistors 402, 404, 406 and 408 are rendered conductive to adjust the equivalent resistance between the drain node 410 and the source node 412. This technique results in the equivalent resistance across the parallel arrangement of the termination transistors 402, 404, 406 and 408 remaining substantially constant when the termination 400 is operating.

Each of the switches 422, 424, 426 and 428 may be a transmission gate according to various embodiments of the invention. Each transmission gate includes an n-channel transistor and a p-channel transistor with drains connected together and sources connected together. Gates of the n-channel transistor and the p-channel transistor can be driven by complementary signals.

Figure 5:
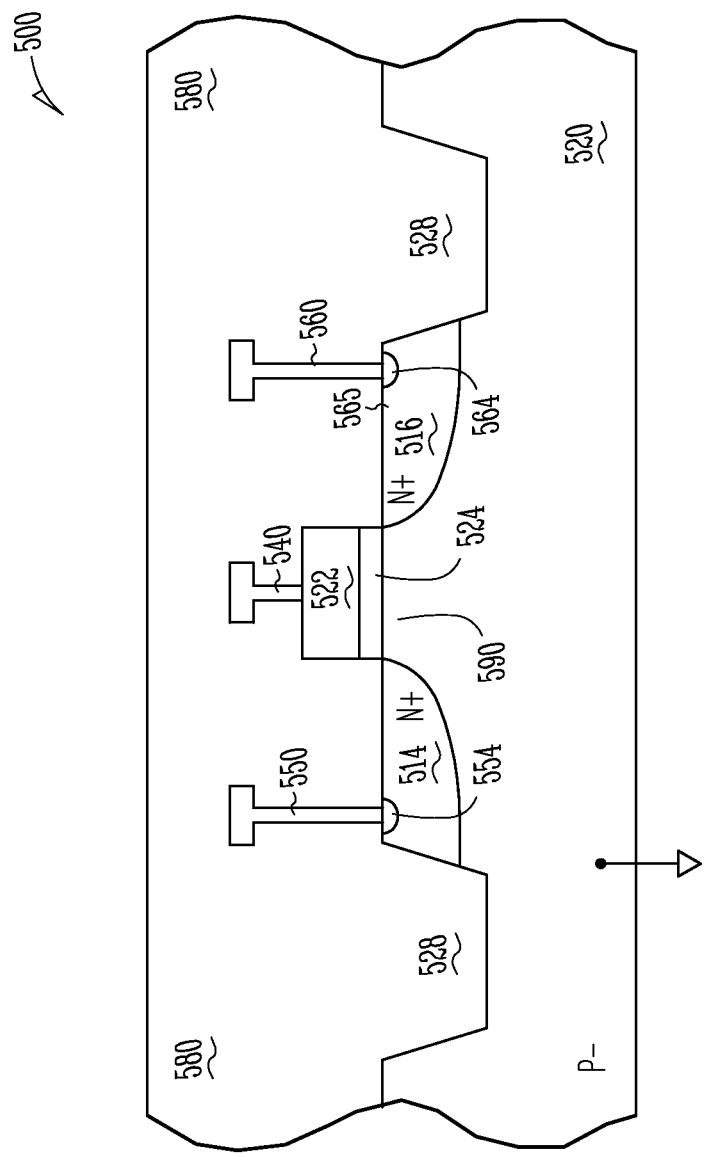
FIG. 5 is a cross-sectional view of an apparatus in the form of a field-effect transistor (FET) according to various embodiments of the invention.

FIG. 5 is a cross-sectional view of an apparatus in the form of a field-effect transistor (FET) 500 according to various embodiments of the invention. The FET 500 may be a termination transistor such as the termination transistors 110, 304, 402, 404, 406 and 408 shown in FIGS. 1, 3 and 4. The FET 500 is an n-channel FET. An N+ type source diffusion region 514 and an N+ type drain diffusion region 516 are formed in a P− type semiconductor material, such as silicon substrate 520. A polysilicon gate 522 is formed over a gate dielectric 524 which is formed over the silicon substrate 520 and between the source diffusion region 514 and the drain diffusion region 516. The gate dielectric 524 may comprise, for example, silicon dioxide ($SiO_{(2)}$), oxynitride or nitrided oxide, according to various embodiments of the invention. A trench 528 in the silicon substrate 520 surrounds an active area of the FET 500. The source diffusion region 514 and the drain diffusion region 516 are formed in the silicon substrate 520 inside the trench 528.

A gate electrode 540 can be connected to the gate 522. A source electrode 550 can be connected to a contact diffusion region 554 inside the source diffusion region 514. A drain electrode 560 can be connected to a contact diffusion region 564 inside the drain diffusion region 516. The FET 500 is covered by a dielectric 580 that extends into the trench 528 and surrounds the electrodes 540, 550 and 560. The dielectric 580 may comprise, for example, silicon dioxide, silicon oxide, silica or Borophosphosilicate glass (BPSG) according to various embodiments of the invention. The electrodes 540, 550 and 560, may comprise metal such as, for example, aluminum, copper, tungsten or polysilicon according to various embodiments of the invention.

During operation of the FET 500 a regulated voltage is coupled to the gate electrode 540 to induce a conductive channel 590 in the silicon substrate 520 between the source diffusion region 514 and the drain diffusion region 516. The silicon substrate 520 is coupled to a reference voltage (e.g., ground). First and second complementary signals are coupled to the source electrode 550 and the drain electrode 560, respectively. The first and second complementary signals are substantially complementary to each other, and may or may not be perfectly complementary to each other. The first and second complementary signals can be the first signal 210 and the second signal 220 shown in FIG. 2. The FET 500 can absorb energy of the first and second complementary signals while the conductive channel 590 remains at a virtual ground because the transitional energies of the complementary signals are substantially equal and opposite. The transitional energy of one of the complementary signals is substantially canceled by the transitional energy of the other complementary signal in the conductive channel 590.

The termination transistors 110, 304, 402, 404, 406 and 408 shown in FIGS. 1, 3 and 4 may be p-channel FETs according to various embodiments of the invention. Appropriate control circuit and a regulation circuit can be coupled to control the p-channel FETs.

Figure 6:
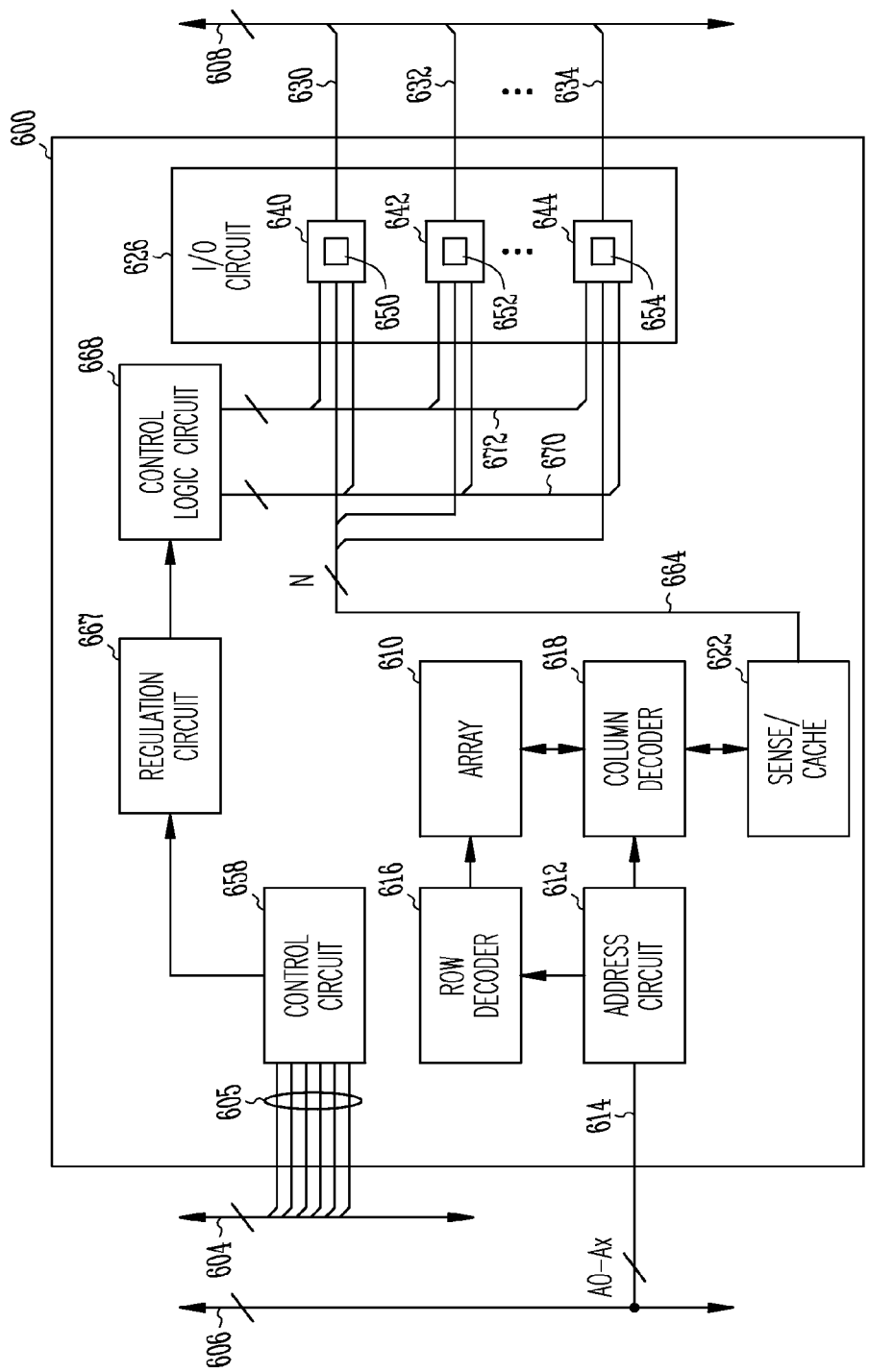
FIG. 6 is a block diagram of an apparatus in the form of a memory device according to various embodiments of the invention.

FIG. 6 is a block diagram of an apparatus in the form of a memory device 600 according to various embodiments of the invention. The memory device 600 is coupled to a control bus 604 to receive a number of control signals on control signal lines 605, an address bus 606 and a data bus 608 which all can be coupled to a controller (not shown). Although depicted as being received on separate busses 604, 606 and 608, the control signals, address signals and/or data signals can be multiplexed together and received on a single bus. The memory device 600 is formed in a single integrated circuit.

The memory device 600 includes one or more arrays 610 of memory cells that can be logically arranged in rows and in columns. The memory cells of the array 610 can be non-volatile memory cells (e.g., flash memory cells) according to various embodiments of the invention. The memory device 600 can be a NOT AND (NAND) memory device. An address circuit 612 can latch address signals received on address signal lines A0-Ax 614. The address signals received on the address signal lines 614 can be decoded by a row decoder 616 and a column decoder 618 to access the array 610 of memory cells.

Data can be read from the array 610 by sensing voltage or current changes in the memory cells in sense devices in a sense/cache circuit 622. The sense/cache circuit 622 is coupled to read and latch a row of data from the array 610.

An I/O circuit 626 facilitates bi-directional data communication through a number of I/O nodes 630, 632 and 634 coupled to the data bus 608. The I/O circuit 626 includes a number of driver and receiver circuits 640, 642 and 644 to drive data on to the I/O nodes 630, 632 and 634, respectively and to receive data from the data bus 608 through the I/O nodes 630, 632 and 634. Each driver and receiver circuit 640, 642 and 644 includes a respective termination 650, 652 and 654 to dissipate and/or dampen signal reflections in the I/O nodes 630, 632 and 634. Each termination 650, 652 and 654 may comprise the termination transistor 110 shown in FIG. 1 or the termination transistor 304 shown in FIG. 3 or the switches 422, 424, 426 and 428 and the termination transistors 402, 404, 406 and 408 shown in FIG. 4.

A control circuit 658 is configured to facilitate operations of the memory device 600, such as writing data to and/or erasing data from the memory cells of the array 610. Data can be transferred between the sense/cache circuit 622 and the I/O circuit 626 over N signal lines 664. A regulation circuit 667 is configured to generate a regulated voltage that can render termination transistors in the terminations 650, 652 and 654 conductive with a substantially constant resistance. A resistance is substantially constant if it is within plus or minus ten percent (10%) of a target resistance. The regulation circuit 667 may comprise the regulation circuit 150 shown in FIG. 1 or the regulation circuit 306 shown in FIG. 3 or the regulation circuit 438 shown in FIG. 4. The regulated voltage can be provided from the regulation circuit 667 to the terminations 650, 652 and 654 through a control logic circuit 668. The control logic circuit 668 can provide control signals over lines 670 and 672 to the terminations 650, 652 and 654 to control switches for the termination transistors such as the switches 422, 424, 426 and 428 shown in FIG. 4.

Figure 7:
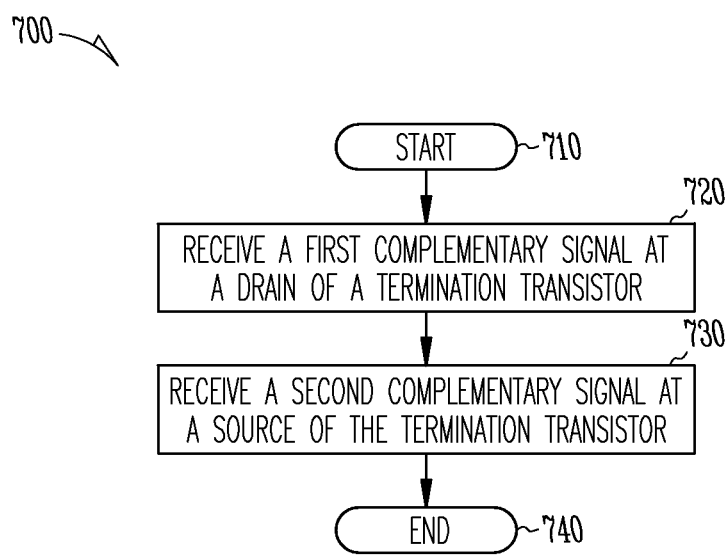
FIG. 7 is a flow diagram of one method according to various embodiments of the invention.

FIG. 7 is a flow diagram of one method 700 according to various embodiments of the invention. In block 710, the method 700 begins. In block 720, a first complementary signal is received at a drain of a termination transistor. In block 730, a second complementary signal is received at a source of the termination transistor. Energy of the first complementary signal and the second complementary signal can be absorbed in the termination transistor when the termination transistor is rendered conductive. In block 740, the method 700 ends. Various embodiments may have more or fewer activities than those shown in FIG. 7. The activities shown may be accomplished in the illustrated order, or in another order. Some activities may be substituted for others.

Figure 8:
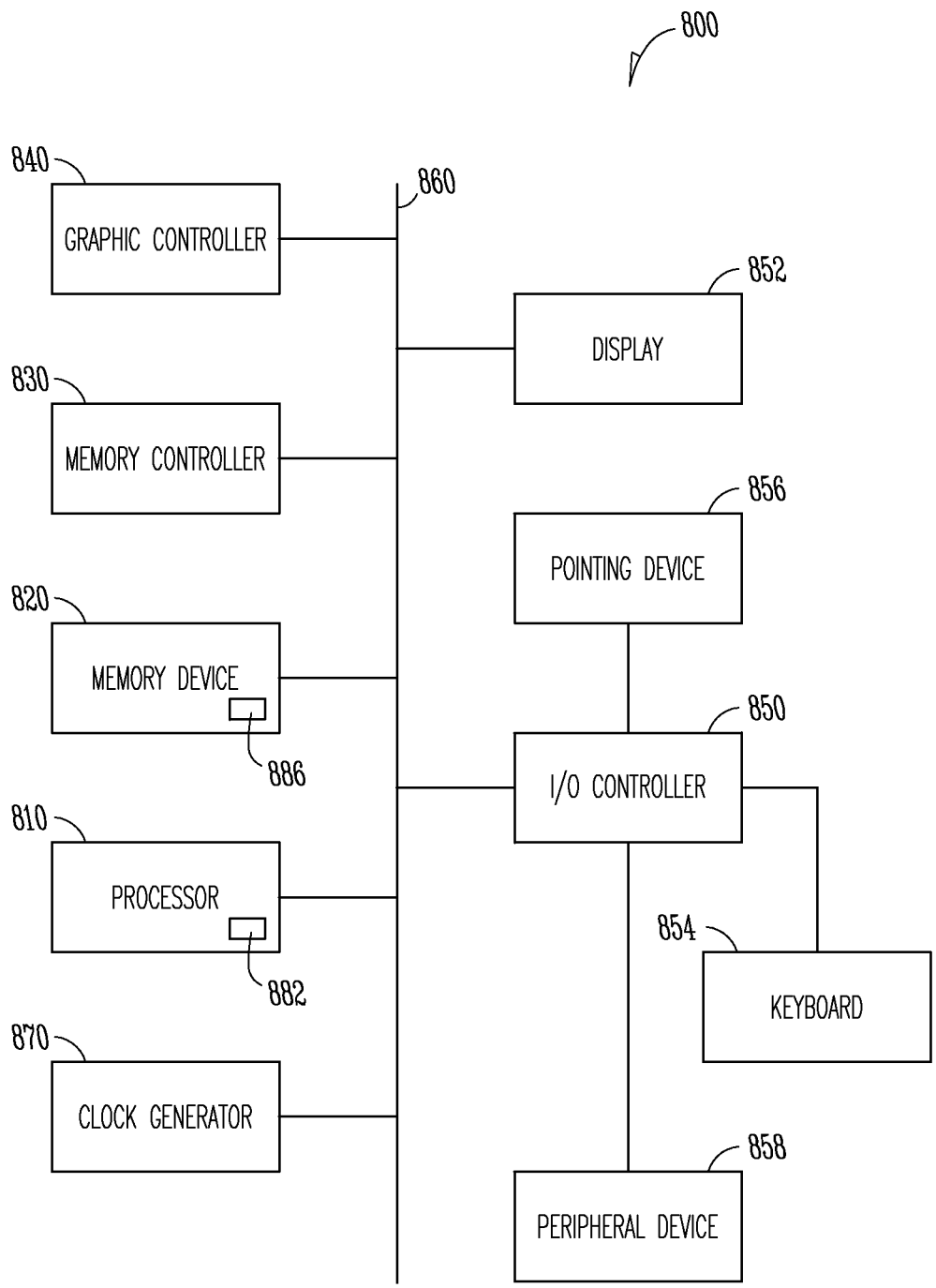
FIG. 8 is a block diagram of an apparatus in the form of a system according to various embodiments of the invention.

FIG. 8 is a block diagram of an apparatus in the form of a system 800 according to various embodiments of the invention. The system 800 may include a processor 810, a memory device 820, a memory controller 830, a graphic controller 840, an I/O controller 850, a display 852, a keyboard 854, a pointing device 856, and a peripheral device 858. A bus 860 couples all of these devices together.

A clock generator 870 can be coupled to the bus 860 to provide a clock signal to at least one of the devices of the system 800 through the bus 860. The clock generator 870 may include an oscillator in a circuit board such as a motherboard. Two or more devices shown in system 800 may be formed in a single integrated circuit chip. The bus 860 may be used to interconnect traces on a circuit board and may comprise one or more cables. The bus 860 may couple the devices of the system 800 by wireless mechanisms, such as by electromagnetic radiation, for example, radio waves. The peripheral device 858 coupled to the I/O controller 850 may be a printer, an optical device such as a CD-ROM and a DVD reader and writer, a magnetic device reader and writer such as a floppy disk driver, or an audio device such as a microphone.

The processor 810 includes a termination 882 to dampen and/or dissipate signal reflections inside the processor 810 or on the bus 860. The memory device 820 includes a termination 886 to dampen and/or dissipate signal reflections inside the memory device 820 or on the bus 860. Each termination 882 and 886 may comprise the termination transistor 110 and the regulation circuit 150 shown in FIG. 1 or the termination transistor 304 and the regulation circuit 306 shown in FIG. 3 or the switches 422, 424, 426 and 428, the termination transistors 402, 404, 406 and 408, the regulation circuit 438 and the control logic circuit 450 shown in FIG. 4.

The system 800 represented by FIG. 8 may include computers (e.g., desktops, laptops, hand-helds, servers, network appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio 3) players, video games, watches, etc.), and the like.

The inventors believe that one or more of the various embodiments of the invention shown and described herein can be used to, for example, terminate lines carrying complementary signals with substantially reduced loading capacitance and/or power dissipation.

Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features can be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
   a plurality of termination transistors coupled in parallel including a first node configured to receive a first complementary signal and a second node configured to receive a second complementary signal wherein the first complementary signal and the second complementary signal are substantially complementary to each other;
   a voltage follower circuit to generate a regulated voltage; and
   a plurality of switches, each of the plurality of switches coupled between the voltage follower circuit and a gate of a respective one of the termination transistors to selectively provide the regulated voltage to the gate of the respective termination transistor to render the respective termination transistor conductive with a substantially constant resistance.

2. The apparatus of claim 1, wherein the voltage follower circuit further comprises an operational amplifier having a non-inverting input coupled to a node of a voltage divider, an inverting input coupled to receive a feedback signal and an output, the operational amplifier to generate the regulated voltage on the output.

3. The apparatus of claim 1, wherein each of the termination transistors comprises an n-channel field-effect transistor.

4. The apparatus of claim 1, wherein each of the termination transistors comprises a p-channel field-effect transistor.

5. An apparatus comprising:
a termination transistor including a first node configured to receive a first complementary signal and a second node configured to receive a second complementary signal wherein the first complementary signal and the second complementary signal are substantially complementary to each other; and
a voltage follower circuit coupled to a gate of the termination transistor to maintain the termination transistor conductive with a substantially constant resistance during changes in a temperature of an integrated circuit including the voltage follower circuit and/or a supply voltage received by the voltage follower circuit, wherein the voltage follower circuit further comprises
an operational amplifier having a non-inverting input coupled to a node of a voltage divider, an inverting input coupled to receive a feedback signal and an output, the operational amplifier arranged to generate a regulated voltage on the output to render the termination transistor conductive with a substantially constant resistance; and
a current source arranged to draw a current from the output of the operational amplifier that changes with a temperature of the integrated circuit including the voltage follower circuit.

6. The apparatus of claim 5, wherein the voltage follower circuit comprises a matched transistor coupled between the output and the inverting input of the operational amplifier to generate the feedback signal, the matched transistor being matched to the termination transistor.

7. An apparatus comprising:
a termination transistor including a first node configured to receive a first complementary signal and a second node configured to receive a second complementary signal wherein the first complementary signal and the second complementary signal are substantially complementary to each other; and
a voltage follower circuit coupled to a gate of the termination transistor to maintain the termination transistor conductive with a substantially constant resistance during changes in a temperature of an integrated circuit including the voltage follower circuit and/or a supply voltage received by the voltage follower circuit, wherein the voltage follower circuit further comprises
an operational amplifier having a non-inverting input coupled to a node of a voltage divider, an inverting input coupled to receive a feedback signal and an output, the operational amplifier to generate a regulated voltage on the output to render the termination transistor conductive with a substantially constant resistance;
a first resistance coupled between the matched transistor and the inverting input of the operational amplifier to generate the feedback signal; and
a second resistance coupled between the inverting input of the operational amplifier and a reference voltage node.

8. A method comprising:
generating a regulated voltage on a gate of a termination transistor in an integrated circuit to render the termination transistor conductive with a substantially constant resistance;
adjusting the regulated voltage in response to a change in a temperature of the integrated circuit and/or a change in a supply voltage received by the integrated circuit;
receiving a first complementary signal at a drain of the termination transistor and a second complementary signal at a source of the termination transistor, wherein the termination transistor absorbs energy of the first complementary signal and the second complementary signal, the first complementary signal being substantially complementary to the second complementary signal; and
wherein generating the regulated voltage further comprises generating the feedback signal through a matched transistor coupled between the output and the inverting input of the operational amplifier, the matched transistor being matched to the termination transistor.

9. The method of claim 8, wherein generating the regulated voltage further comprises generating the regulated voltage on an output of an operational amplifier, the operational amplifier having a non-inverting input coupled to a node of a voltage divider and an inverting input coupled to receive a feedback signal.

10. The method of claim 8, wherein generating the feedback signal further comprises generating the feedback signal through a resistance coupled between the matched transistor and the inverting input of the operational amplifier.

11. The method of claim 10, wherein generating the regulated voltage further comprises drawing a current from the output of the operational amplifier through a current source, the current changing with a temperature of the integrated circuit.

12. An apparatus comprising:
a plurality of termination transistors coupled in parallel between a first node configured to receive a first complementary signal and a second node configured to receive a second complementary signal wherein the first complementary signal and the second complementary signal are substantially complementary to each other;
a regulation circuit to generate a regulated voltage; and
a plurality of switches, each of the plurality of switches being coupled between the regulation circuit and a gate of a respective one of the termination transistors to selectively provide the regulated voltage to the gate of the respective termination transistor to render the respective termination transistor conductive with a substantially constant resistance.

13. The apparatus of claim 12, further comprising a control logic circuit to switch each switch on or off.

14. The apparatus of claim 12, wherein each switch comprises a transistor.

15. The apparatus of claim 12, wherein each switch comprises a transmission gate.

16. The apparatus of claim 12, wherein each termination transistor comprises:
a source and a drain formed in a semiconductor material, the semiconductor material being coupled to a reference voltage node; and
a gate formed over a gate dielectric, the gate dielectric being formed over the semiconductor material between the source and the drain.

* * * * *

UNITED STATES PATENT AND TRADEMARK OFFICE
CERTIFICATE OF CORRECTION

PATENT NO. : 8,648,619 B2  Page 1 of 1
APPLICATION NO. : 13/302909
DATED : February 11, 2014
INVENTOR(S) : William Kammerer et al.

It is certified that error appears in the above-identified patent and that said Letters Patent is hereby corrected as shown below:

On the title page, item (57), in column 2, line 12, delete "complimentary" and insert -- complementary --, therefor.

Signed and Sealed this
Thirteenth Day of May, 2014

Michelle K. Lee
*Deputy Director of the United States Patent and Trademark Office*